United States Patent
Tsubota et al.

(10) Patent No.: US 10,207,438 B2
(45) Date of Patent: Feb. 19, 2019

(54) COMPOSITE MEMBER AND COMPOSITE-MEMBER MANUFACTURING METHOD

(71) Applicant: SUMITOMO ELECTRIC INDUSTRIES, LTD., Osaka-shi, Osaka (JP)

(72) Inventors: Taisuke Tsubota, Hyogo (JP); Ryuichi Inoue, Hyogo (JP); Masatada Numano, Hyogo (JP); Osamu Mizuno, Hyogo (JP); Motoyoshi Tanaka, Hyogo (JP); Nozomu Kawabe, Hyogo (JP); Katsuyuki Aoki, Shiga (JP)

(73) Assignee: SUMITOMO ELECTRIC INDUSTRIES, LTD., Osaka-shi, Osaka (JP)

(*) Notice: Subject to any disclaimer, the term of this patent is extended or adjusted under 35 U.S.C. 154(b) by 174 days.

(21) Appl. No.: 15/025,563

(22) PCT Filed: Jan. 9, 2015

(86) PCT No.: PCT/JP2015/050438
§ 371 (c)(1),
(2) Date: Mar. 29, 2016

(87) PCT Pub. No.: WO2015/115150
PCT Pub. Date: Aug. 6, 2015

(65) Prior Publication Data
US 2016/0207236 A1    Jul. 21, 2016

(30) Foreign Application Priority Data

Jan. 31, 2014    (JP) .................................. 2014-016621

(51) Int. Cl.
*B29C 45/14*    (2006.01)
*B29C 70/74*    (2006.01)
(Continued)

(52) U.S. Cl.
CPC ........ *B29C 45/14344* (2013.01); *B21D 11/08* (2013.01); *B21D 35/001* (2013.01);
(Continued)

(58) Field of Classification Search
None
See application file for complete search history.

(56) References Cited

U.S. PATENT DOCUMENTS 2,392,734 A * 1/1946 Haberstump .......... B27G 11/00
52/284
4,228,912 A * 10/1980 Harris ...................... B65D 7/38
220/4.01
(Continued)

FOREIGN PATENT DOCUMENTS

CN    101618412 A *   1/2010  ......... B29C 37/0082
CN    201491423 U     5/2010
(Continued)

OTHER PUBLICATIONS

English Abstract and Machine Translation of JP 02-258116 A (Year: 1990).*
(Continued)

*Primary Examiner* — Jeffrey A Vonch
(74) *Attorney, Agent, or Firm* — Drinker Biddle & Reath LLP

(57) ABSTRACT

A composite member includes a metal sheet having a bent portion formed by bending, and a resin member joined to at least a part of the bent portion. The metal sheet includes an opening provided on an inner side of the bent portion, and a tapered recess that tapers off from an outer side of the bent portion toward the opening. The resin member includes an inner resin part filled in the recess, and an exposed resin part
(Continued)

provided to be continuous with the inner resin part and to extend to an inner surface of the bent portion through an edge portion of the opening.

21 Claims, 7 Drawing Sheets

(51) Int. Cl.
| | |
|---|---|
| *B29C 70/78* | (2006.01) |
| *B21D 5/00* | (2006.01) |
| *B21D 11/08* | (2006.01) |
| *B21D 35/00* | (2006.01) |
| *H04M 1/02* | (2006.01) |
| *H05K 5/02* | (2006.01) |
| *H05K 5/04* | (2006.01) |
| *B32B 3/26* | (2006.01) |
| *G06F 1/16* | (2006.01) |
| *B32B 15/06* | (2006.01) |
| *B32B 3/30* | (2006.01) |
| *B32B 1/02* | (2006.01) |
| *B32B 15/08* | (2006.01) |
| *B29K 101/10* | (2006.01) |
| *B29K 21/00* | (2006.01) |
| *B29K 705/02* | (2006.01) |
| *B29K 705/12* | (2006.01) |
| *B29K 705/08* | (2006.01) |
| *B29K 705/00* | (2006.01) |
| *B29K 101/12* | (2006.01) |
| *B29L 31/34* | (2006.01) |
| *B29C 37/00* | (2006.01) |
| *B29C 45/00* | (2006.01) |

(52) U.S. Cl.
CPC ............ *B21D 35/002* (2013.01); *B32B 3/266* (2013.01); *G06F 1/1633* (2013.01); *H04M 1/0202* (2013.01); *H05K 5/02* (2013.01); *H05K 5/04* (2013.01); *B29C 37/0085* (2013.01); *B29C 45/14221* (2013.01); *B29C 45/14336* (2013.01); *B29C 45/14409* (2013.01); *B29C 70/745* (2013.01); *B29C 2045/0093* (2013.01); *B29C 2045/14327* (2013.01); *B29C 2045/14352* (2013.01); *B29C 2045/14368* (2013.01); *B29K 2021/00* (2013.01); *B29K 2101/10* (2013.01); *B29K 2101/12* (2013.01); *B29K 2705/00* (2013.01); *B29K 2705/02* (2013.01); *B29K 2705/08* (2013.01); *B29K 2705/12* (2013.01); *B29K 2995/0012* (2013.01); *B29K 2995/0058* (2013.01); *B29K 2995/0077* (2013.01); *B29L 2031/3481* (2013.01); *B32B 1/02* (2013.01); *B32B 3/30* (2013.01); *B32B 15/06* (2013.01); *B32B 15/08* (2013.01); *B32B 2307/30* (2013.01); *B32B 2307/54* (2013.01); *B32B 2307/714* (2013.01); *B32B 2311/18* (2013.01); *B32B 2311/24* (2013.01); *B32B 2311/30* (2013.01); *B32B 2319/00* (2013.01); *B32B 2398/10* (2013.01); *B32B 2398/20* (2013.01); *B32B 2457/00* (2013.01); *H05K 5/0217* (2013.01); *Y10S 72/00* (2013.01); *Y10T 428/1355* (2015.01); *Y10T 428/2419* (2015.01); *Y10T 428/2462* (2015.01); *Y10T 428/24174* (2015.01); *Y10T 428/24322* (2015.01); *Y10T 428/24331* (2015.01); *Y10T 428/24339* (2015.01); *Y10T 428/24545* (2015.01); *Y10T 428/24612* (2015.01); *Y10T 428/24777* (2015.01)

(56) References Cited

U.S. PATENT DOCUMENTS

| | | | | |
|---|---|---|---|---|
| 4,318,604 | A * | 3/1982 | Kobori | G03B 17/02 396/535 |
| 4,619,048 | A * | 10/1986 | Greutert | B26B 19/384 30/346.51 |
| 5,531,950 | A * | 7/1996 | Kimura | B29C 37/0078 264/135 |
| 5,672,405 | A * | 9/1997 | Plank, Jr. | B29C 45/14311 264/273 |
| 6,365,086 | B1 * | 4/2002 | Schoonover | B29C 37/0082 264/261 |
| 6,388,722 | B1 * | 5/2002 | Yoshii | G02B 6/0083 349/58 |
| 6,481,259 | B1 * | 11/2002 | Durney | B21D 5/00 229/931 |
| 2002/0021549 | A1 * | 2/2002 | Kono | B29C 45/1418 361/679.01 |
| 2002/0157775 | A1 * | 10/2002 | Bauhoff | B29C 45/14311 156/245 |
| 2002/0184936 | A1 * | 12/2002 | Gitlin | B21D 5/00 72/379.2 |
| 2003/0037586 | A1 * | 2/2003 | Durney | B21D 28/10 72/379.2 |
| 2004/0134250 | A1 * | 7/2004 | Durney | B21D 28/10 72/324 |
| 2006/0147732 | A1 * | 7/2006 | Chocroun | B21D 11/08 428/457 |
| 2007/0138920 | A1 * | 6/2007 | Austin | H05K 5/0217 312/7.1 |
| 2007/0232370 | A1 * | 10/2007 | Kim | G06F 1/1624 455/575.4 |
| 2008/0160253 | A1 * | 7/2008 | Liu | B29C 45/14344 428/138 |
| 2009/0260871 | A1 * | 10/2009 | Weber | B32B 37/02 174/535 |
| 2009/0265915 | A1 * | 10/2009 | Lee | H01Q 1/084 29/600 |
| 2009/0267266 | A1 * | 10/2009 | Lee | G06F 1/1616 264/272.11 |
| 2009/0280347 | A1 * | 11/2009 | Yu | H01Q 1/084 428/545 |
| 2009/0323263 | A1 * | 12/2009 | Hsu | H05K 5/04 361/679.01 |
| 2010/0215938 | A1 * | 8/2010 | Wang | B29C 45/14311 428/223 |
| 2010/0255732 | A1 * | 10/2010 | Kohmura | B29C 45/006 439/733.1 |
| 2010/0270052 | A1 * | 10/2010 | Crohas | B29C 45/14 174/50 |
| 2011/0033657 | A1 * | 2/2011 | Huang | G06F 1/1615 428/138 |
| 2011/0158566 | A1 * | 6/2011 | Timperi | F16C 29/02 384/7 |
| 2011/0165366 | A1 * | 7/2011 | Wang | B29C 45/14311 428/68 |
| 2011/0186455 | A1 * | 8/2011 | Du | H05K 5/0243 206/320 |
| 2011/0223382 | A1 * | 9/2011 | Gu | B29C 70/78 428/136 |
| 2012/0039058 | A1 * | 2/2012 | Kinjou | G06F 1/1698 361/807 |
| 2012/0207537 | A1 * | 8/2012 | Huang | G06F 1/183 403/265 |
| 2012/0301668 | A1 * | 11/2012 | Numano | B32B 15/08 428/138 |
| 2013/0009525 | A1 * | 1/2013 | Liao | B29C 45/14336 312/223.1 |
| 2013/0210504 | A1 * | 8/2013 | Mareno | H04M 1/026 455/575.8 |

(56) References Cited

U.S. PATENT DOCUMENTS

| | | | |
|---|---|---|---|
| 2013/0278123 A1* | 10/2013 | Liao | B29C 45/1671 312/265.5 |
| 2013/0285516 A1* | 10/2013 | Mizoguchi | H05K 5/02 312/7.2 |
| 2013/0335644 A1* | 12/2013 | Horii | H04N 5/64 348/836 |
| 2014/0072761 A1* | 3/2014 | Kawada | B29C 45/14311 428/138 |

FOREIGN PATENT DOCUMENTS

| | | | | |
|---|---|---|---|---|
| CN | 101722622 A | * | 6/2010 | |
| CN | 201584118 U | * | 9/2010 | |
| CN | 102056724 A | | 5/2011 | |
| CN | 102442028 A | | 5/2012 | |
| CN | 102501376 A | * | 6/2012 | |
| CN | 202371653 U | * | 8/2012 | |
| CN | 103376835 A | * | 10/2013 | |
| CN | 203243650 U | * | 10/2013 | |
| CN | 104625644 A | | 5/2015 | |
| CN | 205247015 U | * | 5/2016 | ....... B29C 45/14311 |
| DE | 2424722 A | * | 11/1975 | ....... B29C 45/14344 |
| DE | 2509355 A | * | 6/1976 | ......... B29C 37/0085 |
| DE | 3041900 A | * | 6/1982 | ............. A45C 11/24 |
| DE | 3830737 A1 | * | 3/1990 | ............. D06F 39/12 |
| DE | 29818909 U1 | * | 12/1998 | ................ B21D 5/00 |
| EP | 0065505 A2 | * | 11/1982 | ......... B29C 37/0085 |
| EP | 0 802 338 B1 | | 9/2003 | |
| FR | 2428372 A | * | 1/1980 | ............. B65D 1/225 |
| FR | 2550412 A3 | * | 2/1985 | ................ H05K 5/04 |
| FR | 2816543 A1 | * | 5/2002 | ....... B29C 45/14073 |
| GB | 2002674 A | * | 2/1979 | ....... B29C 45/14344 |
| GB | 1603168 A | * | 11/1981 | ......... B29C 37/0082 |
| GB | 2197810 A | * | 6/1988 | ............. B21D 11/08 |
| GB | 2404498 A | * | 2/2005 | ............. G06F 1/1613 |
| JP | 52124820 A | * | 10/1977 | ....... B29C 45/14344 |
| JP | 52136520 A | * | 11/1977 | ......... B29C 37/0085 |
| JP | 54077019 A | * | 6/1979 | ............. B29C 53/06 |
| JP | 54103481 A | * | 8/1979 | |
| JP | 55071518 A | * | 5/1980 | ............. B29C 53/06 |
| JP | 55133939 A | * | 10/1980 | |
| JP | 55133941 A | * | 10/1980 | |
| JP | 56021818 A | * | 2/1981 | ........... B29C 53/066 |
| JP | 56021819 A | * | 2/1981 | ........... B29C 53/066 |
| JP | 58036411 A | * | 3/1983 | ....... B29C 45/14344 |
| JP | 60046819 A | * | 3/1985 | ............. B21D 11/08 |
| JP | 02192821 A | * | 7/1990 | |
| JP | 02258116 A | * | 10/1990 | |
| JP | H04-55560 A | | 2/1992 | |
| JP | 04224085 A | * | 8/1992 | |
| JP | 06334377 A | * | 12/1994 | |
| JP | 10209649 A | * | 8/1998 | |
| JP | 11254481 A | * | 9/1999 | |
| JP | 2001-121650 A | | 5/2001 | |
| JP | 2001315162 A | * | 11/2001 | |
| JP | 2003103563 A | * | 4/2003 | |
| JP | 2003170531 A | * | 6/2003 | |
| JP | 2003185172 A | * | 7/2003 | |
| JP | 2004240239 A | * | 8/2004 | |
| JP | 2006-017131 A | | 1/2006 | |
| JP | 2010-069699 A | | 4/2010 | |
| JP | 2011191600 A | * | 9/2011 | |
| JP | 2011250205 A | * | 12/2011 | |
| JP | 2012192421 A | * | 10/2012 | |
| JP | 2014050863 A | | 3/2014 | |
| KR | 20060005296 A | * | 1/2006 | |
| KR | 100961187 B1 | * | 6/2010 | |
| TW | M343174 U | * | 10/2008 | ................ B21D 5/00 |
| WO | WO 2009/129123 A1 | | 10/2009 | |
| WO | WO-2012033017 A1 | * | 3/2012 | |
| WO | WO-2012062004 A1 | * | 5/2012 | ....... B29C 45/14311 |

OTHER PUBLICATIONS

Machine Translation of JP 60-046819 A (Year: 1985).*
Machine Translation of JP 2003-185172 A (Year: 2003).*
Machine Translation of JP 2012192421 A, Oct. 2012 (Year: 2012).*
Machine Translation of WO 2012033017 A1, Mar. 2012 (Year: 2012).*
Machine Translation of KR 20060005296 A, Jan. 2006 (Year: 2006).*
Machine Translation of CN 202371653 U, Aug. 2012 (Year: 2012).*

* cited by examiner

COMPOSITE MEMBER AND COMPOSITE-MEMBER MANUFACTURING METHOD

TECHNICAL FIELD

The present invention relates to a composite member that can be suitably used in, for example, a housing of a mobile electric device, and a manufacturing method for the composite member.

BACKGROUND ART

Various retrofit parts (for example, a substrate with an IC chip mounted thereon and a monitor) are generally attached to a housing of a mobile electric device according to use modes. When the housing is formed by a metal member, it is demanded that the housing has attachment portions for the retrofit parts. PTL 1 discloses a magnesium alloy structural member having a resin member serving as an attachment portion in an edge portion of a rolled sheet of a magnesium alloy. Specifically, in the magnesium alloy structural member, a through hole is provided in the rolled sheet of the magnesium alloy, the resin member is joined to cover an inner surface of the through hole, and the resin member extends to one surface and the other surface of the rolled sheet, so that the resin member is firmly joined to the rolled sheet. For example, this magnesium alloy structural member is manufactured by forming a through hole in a rolled sheet by punching, placing the rolled sheet having the through hole in a mold, and then performing insert molding with resin inserted in the mold.

CITATION LIST

Patent Literature

PTL 1: Japanese Unexamined Patent Application Publication No. 2010-69699

SUMMARY OF INVENTION

Technical Problem

In the above-described technique of PTL 1, the resin member is fixed while being formed to extend from the inner peripheral surface of the through hole formed in the rolled sheet onto both surfaces of the rolled sheet. Hence, the resin member rises on both surfaces of the rolled sheet. According to the use mode of the housing, it is demanded that the resin member is provided on only one surface of the rolled sheet (metal sheet). For example, when parts are attached inside the housing, it is unnecessary to form the resin member on an outer side of the housing. Accordingly, there is a demand for a composite member in which a metal sheet and a resin member can be firmly joined without forming the resin member along an outer side surface of the metal sheet.

The present invention has been made in view of the above circumstance, and one object of the present invention is to provide a composite member in which a metal sheet and a resin member are joined firmly. Another object of the present invention is to provide a composite-member manufacturing method that can efficiently obtain a composite member in which a metal sheet and a resin member are joined firmly.

Solution to Problem

A composite member according to the present invention includes a metal sheet having a bent portion formed by bending, and a resin member joined to at least a part of the bent portion. The metal sheet includes an opening provided on an inner side of the bent portion and a tapered recess that tapers off from an outer side of the bent portion toward the opening. The resin member includes an inner resin part filled in the recess and an exposed resin part provided to be continuous with the inner resin part and to extend to an inner surface of the bent portion through an edge portion of the opening.

A composite-member manufacturing method according to the present invention includes the following steps.

(A) a preparation step of preparing a metal sheet shaped like a flat sheet.

(B) a recess forming step of forming a recess having an opening in at least a part of a portion of the metal sheet subjected to bending.

(C) a bending step of subjecting the metal sheet to bending with the opening being disposed on an inner side of a bent portion.

(D) a resin filling step of filling the recess with resin and molding the resin so that the resin extends to an inner surface of the bent portion of the metal sheet through an edge portion of the opening.

Advantageous Effects of Invention

According to the composite member of the present invention, the metal sheet and the resin member are joined firmly.

According to the composite-member manufacturing method of the present invention, it is possible to efficiently obtain a composite member in which a metal sheet and a resin member are joined firmly.

DESCRIPTION OF EMBODIMENTS

Description of Embodiments of the Invention

Figure 1:
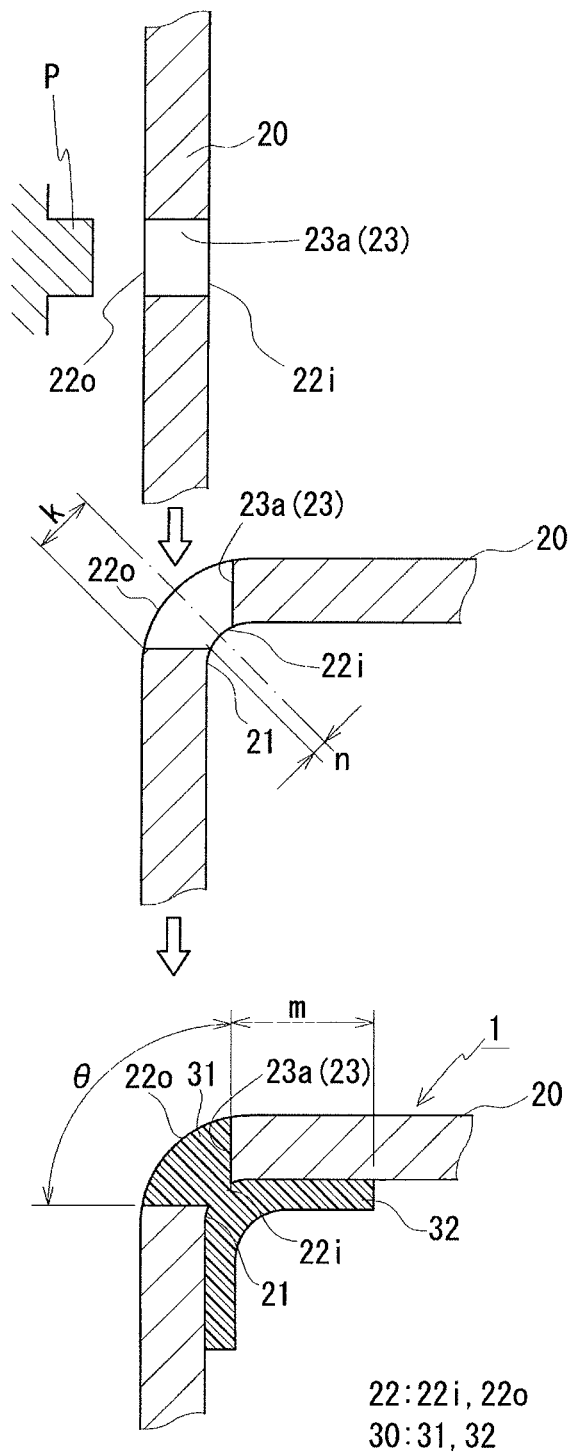
FIG. 1 is a procedure explanatory view schematically illustrating a method for manufacturing a composite member according to a first embodiment.

To join a metal sheet and a resin member, the present inventors considered to form a tapered recess that tapered off from one surface of the metal sheet (an outer surface of a housing) toward the other surface (an inner surface of the housing) and to build up a fall prevention structure for the resin member by the tapered recess. By forming the resin member inside the recess and on the inner surface of the housing through an edge portion of an opening provided in a narrow portion of the taper with the opening being disposed as the boundary, the resin member can be retained in a region continuing from the taper surface to the inner surface of the housing. For example, the tapered recess is formed by a method including steps of preparing a metal sheet shaped like a flat sheet, shaping a housing by subjecting the metal sheet to bending, forming a straight recess in a flat portion of the housing from the inner surface toward the outer surface of the housing, and forming a taper in the recess. For example, this taper is formed by a cutting step separate from the step of forming the straight recess.

The present inventors further examined efficient formation of the tapered recess. As a result, the present inventors found that the number of manufacturing steps could be reduced by forming the recess in a corner portion (a bent portion formed by bending) of the housing. Specifically, the present inventors conceived a method of preparing a metal sheet shaped like a flat sheet, forming a straight recess in a flat portion of the metal sheet, and performing bending with an opening of the recess being disposed on an inner side of a bent portion to shape a housing. The present inventors obtained findings that a step of forming a taper in the recess with a cutting tool or the like could be omitted because a tapered recess that tapered off along the bent portion from the outer side toward the inner side of the bent portion was formed by bending the straight recess, and then completed the present invention. The contents of embodiments of the present invention will be listed and described below.

(1) A composite member according to an embodiment includes a metal sheet having a bent portion formed by bending, and a resin member joined to at least a part of the bent portion. The metal sheet includes an opening provided on an inner side of the bent portion and a tapered recess that tapers off from an outer side of the bent portion toward the opening. The resin member includes an inner resin part filled in the recess and an exposed resin part provided to be continuous with the inner resin part and to extend to an inner surface of the bent portion through an edge portion of the opening.

According to the composite member of the above-described embodiment, the tapered recess provided in the bent portion of the metal sheet serves as a fall prevention structure for the resin member. Even when the resin member is provided on only one surface of the metal sheet (an inner surface of the composite member (housing)), the metal sheet and the resin member can be joined firmly. This is because the opening of the recess is a narrow portion, the resin member is joined to extend from the taper surface to the inner surface of the bent portion through an edge portion of the opening, and the inner resin part and the exposed resin part are caught in a region continuing from the taper surface to the inner surface of the bent portion. Hence, the inner resin part and the exposed resin part are caught in the region with the opening as the boundary, regardless of whether force is applied to the inner side or the outer side of the bent portion. Thus, the resin member is hard to come off the metal sheet.

(2) In a composite member according to an embodiment, the recess is a through hole.

Since the recess is a through hole, the composite member can have textures of both metal and resin when viewed from the outer side. By painting the resin to have a metallic texture, design can also be made as if the metal sheet and the resin member were formed of the same material. By changing the color of the resin or painting the resin, designability can be enhanced. Further, since the metal is partly left off, the position of the through hole can be utilized as a propagating position for electromagnetic waves. For example, when an antenna is disposed near the through hole on the inner side of the metal sheet, the electromagnetic waves received by and transmitted to the antenna are not shielded by the metal sheet.

(3) In a composite member according to an embodiment, the recess is a groove.

Since the recess is a groove, a hole does not exist on the outer side of the composite member. Hence, the composite member can have a metallic texture all over its outer side when viewed from the outer side.

(4) In a composite member according to an embodiment, the metal sheet has a fitting recess filled with the exposed resin part.

When the fitting recess is filled with the exposed resin part, the joint area between the metal sheet and the exposed resin part increases. Moreover, since the resin member is caught by the metal sheet, it is less likely to come off the metal sheet. On the inner surface of the composite member, the inner surfaces of the exposed resin part and the metal sheet can be flush with each other, and this widens the inner space.

(5) In a composite member according to an embodiment, the composite member is a housing of an electric device.

Since the metal sheet and the resin member are firmly joined in the composite member of this embodiment, the composite member can be suitably used in a housing of an electric device to which various retrofit parts are desired to be attached, for example, a housing of a cellular phone or a personal computer.

(6) A composite-member manufacturing method according to an embodiment includes the following steps.

(A) a preparation step of preparing a metal sheet shaped like a flat sheet.

(B) a recess forming step of forming a recess having an opening in at least a part of a portion of the metal sheet subjected to bending.

(C) a bending step of subjecting the metal sheet to bending with the opening being disposed on an inner side of a bent portion.

(D) a resin filling step of filling the recess with resin and molding the resin so that the resin extends to an inner surface of the bent portion of the metal sheet through an edge portion of the opening.

According to the composite-member manufacturing method of the above-described embodiment, since a taper can be formed in the recess by utilizing bending, the composite member can be manufactured efficiently. It is considered that a taper is generally formed in the recess by forming a straight recess and forming a taper in the recess with a drill or the like. In the manufacturing method of this embodiment, a taper can be easily formed in the recess by forming a straight recess in a metal sheet shaped like a flat sheet and subjecting the metal sheet to bending with an opening of the recess being disposed on an inner side of a bent portion to shape a housing. When the straight recess is bent, it is plastically deformed into a tapered recess that tapers off along the bent portion from the outer side toward the inner side of the bent portion. Hence, the step of forming a taper in the recess with a cutting tool or the like can be omitted, and this enhances productivity. In particular, the composite-member manufacturing method of the embodiment is effective when a plurality of tapered recesses are formed along a ridge line direction of a corner portion formed by bending.

(7) In a composite-member manufacturing method according to an embodiment, the preparation step includes a punching step of punching a blank in a predetermined shape to form the metal sheet shaped like the flat sheet, the recess forming step is performed simultaneously with the punching step, and the recess is formed by boring a through hole that penetrates both surfaces of the blank.

In a case in which the recess is a through hole, when the through hole is bored simultaneously with the punching step of punching the blank, a tapered through hole (recess) can be formed efficiently. Particularly when a plurality of tapered through holes are formed, they can be bored at the same time. Since tapers can be formed in the plurality of through holes by performing bending with the openings at one side of the through holes being disposed on the inner side of the bent portion, tapered through holes can be formed efficiently.

(8) As a composite member according to an embodiment, a composite member manufactured by the composite-member manufacturing method of the above embodiment (6) or (7) is proposed.

In the composite member of this embodiment, the tapered recess formed in the bent portion of the metal sheet serves as a fall prevention structure for the resin member, and allows the metal sheet and the resin member to be joined firmly. Further, since a straight recess is formed in the metal sheet and a taper is formed in the recess by utilizing bending when shaping the metal sheet into a housing, the composite member can be efficiently manufactured, and this increases productivity.

DETAILS OF EMBODIMENTS OF THE INVENTION

Details of embodiments of the present invention will be described below. The present invention is not limited to these examples. The scope of the present invention is defined by the claims, and it is intended to include all modifications within the scope of the claims and the equivalents thereof. In the drawings, the same reference numerals denote components of the same name.

First Embodiment

«Composite Member»

As illustrated in the lower diagram of FIG. 1, in a composite member 1 according to this embodiment, a metal sheet 20 and a resin member 30 are joined at a bent portion 21 of the metal sheet 20 subjected to bending.

[Metal Sheet]

The material of the metal sheet is, for example, pure magnesium, a magnesium alloy, pure titanium, a titanium alloy, pure aluminum, an aluminum alloy, pure iron, or an iron alloy (including steel and stainless steel). All of these metals satisfy the conditions that the Young's modulus is 40 GPa or more, the 0.2% proof stress is 150 MPa or more, and the thermal expansion coefficient is $8 \times 10^{-6}$/K or more, have high rigidity, are unsusceptible to deformation such as a dent or a warp, and easily maintain the shape over the long term.

Particularly when at least a part of the metal sheet is formed of at least one of pure magnesium, a magnesium alloy, pure titanium, and a titanium alloy, the metal sheet is easily thinned because these metals are excellent in strength and rigidity. Further, the weight of the composite member is easily reduced because pure magnesium, a magnesium alloy, pure titanium, and a titanium alloy are lighter than iron and an iron alloy.

Above all, magnesium and a magnesium alloy are likely to form a high-strength and high-rigidity composite member because they have high relative strength and high relative rigidity. Magnesium is composed of Mg and inevitable impurities. The magnesium alloy contains, for example, a total of 0.01 mass % to 20 mass % of at least one element selected from Al, Zn, Mn, Si, Be, Ca, Sr, Y, Cu, Ag, Sn, Li, Zr, Ce, Ni, Au and rare-earth elements (excluding Y and Ce), and the remaining part is composed of Mg and inevitable impurities. Especially, a magnesium alloy containing Al is preferable because it is excellent in corrosion resistance and is also excellent in the mechanical property such as strength. For example, according to the American Society for Testing and Material Standard, a more specific composition of the Mg—Al alloy is an AZ alloy (Mg—Al—Zn alloy, Zn: 0.2 mass % to 1.5 mass %), an AM alloy (Mg—Al—Mn alloy, Mn: 0.05 mass % to 0.5 mass %), an AS alloy (Mg—Al—Si alloy, Si: 0.3 mass % to 4.0 mass %), an Mg—Al-RE (rare-earth element) alloy, an AX alloy (Mg—Al—Ca alloy, Ca: 0.2 mass % to 6.0 mass %), an AZX alloy (Mg—Al—Zn—Ca alloy, Zn: 0.2 mass % to 1.5 mass %, Ca: 0.1 mass % to 4.0 mass %), or an AJ alloy (Mg—Al—Sr alloy, Sr: 0.2 mass % to 7.0 mass %). The content of Al is preferably 3 mass % or more, more preferably 5.5 mass % or more, and further preferably 7.3 mass % or more. However, when the content of Al exceeds 12 mass %, plastic formability is reduced. Hence, the upper limit is 12 mass %. The content of Al is preferably 11 mass % or less, more preferably 10.5 mass % or less, and particularly preferably within the range of 8.3 mass % to 9.5 mass %.

At least a part of the metal part can be formed of at least one metal selected from pure aluminum, an aluminum alloy, pure iron, and an iron alloy. Since pure aluminum, an aluminum alloy, pure iron, and an iron alloy are generally excellent in formability of plastic formation such as rolling and pressing, they allow a plastically formed material to be easily formed in a desired shape. Since pure aluminum and an aluminum alloy are light, a composite member including a metal sheet formed of pure aluminum or an aluminum alloy can be light. Pure aluminum can be composed of Al and inevitable impurities, and an aluminum alloy can be formed of various alloys specified in JIS H 4000 (2006), for example, A1050, A5052, and A5083. Since pure iron and an iron alloy are generally excellent in strength, a composite member including a metal sheet formed of pure iron or an iron alloy can have high strength. Pure iron can be composed of Fe and inevitable impurities. As the iron alloy, steel serving as an alloy of carbon and iron and stainless steel further containing Ni and Cr, for example, SUS304 or SUS316 can be utilized.

The metal sheet 20 has the bent portion 21 formed by bending, and is, for example, angular-U-shaped or L-shaped in cross section. When the composite member is a housing of an electric device, it is shaped like a bottomed box having a bottom sheet part and a side wall part standing from the bottom sheet part, and a corner portion connecting the bottom sheet part and the side wall part is a bent portion formed by bending. The bent portion is sometimes a corner portion that connects two surfaces of a bottom sheet part and a side wall part or is sometimes a corner portion that connects a total of three surfaces of a bottom sheet part and two side wall parts.

The bent portion 21 has a recess 23 having an opening 22 in the bent portion 21. In this embodiment, the recess 23 is a through hole 23a having an inner opening 22i and an outer opening 22o on the inner and outer sides of the bent portion 21, respectively. The through hole 23a is tapered to taper off from the outer opening 22o toward the inner opening 22i. That is, the through hole 23a is fan-shaped in cross section so that the size of the inner opening 22i is smaller than the size of the outer opening 22o.

An angle θ (lower diagram of FIG. 1) at the intersection on extension lines of the taper of the through hole 23a is, for example, within the range of 60 to 150 degrees. In a case in which the angle θ is 60 or more degrees, when the through hole 23a is filled with resin and the resin member 30 is formed to extend to the inner surface of the bent portion 21, the resin filled in the through hole 23a can be hard to come off the metal sheet 20. This angle θ is more preferably 90 or more degrees. When the angle θ is 90 degrees, the composite member 1 is suitably used as the housing. Since the degree of bending of the bent portion 21 increases as the angle θ increases, the angle θ is preferably 135 or less degrees, and more preferably 120 or less degrees.

For example, the metal sheet 20 has an arbitrary shape with a thickness within the range of 0.5 to 5.0 mm. When the thickness is 0.5 mm or more, the joint area between the taper surface of the through hole 23a and the resin member 30 increases. Hence, the resin member 30 can be hard to come off the metal sheet 20. Since the strength and rigidity of the composite member 1 increase as the thickness increases, the thickness is more preferably 1.0 mm or more. Since the size of the composite member 1 increases as the thickness increases, the thickness is further preferably 3.0 mm or less.

A metal sheet can be manufactured through various steps such as casting, extrusion, rolling, forging, and pressing (typically, bending or drawing). Known manufacturing conditions can be appropriately utilized for manufacturing. The obtained metal sheet is applied to various modes, for example, a cast material, an excluded material, a rolled material, a forged material, a pressed material, other plastic formed materials, and a treated material obtained by further subjecting these materials to at least one of heat treatment, polishing, correction, cutting, anticorrosion treatment, and surface treatment. When the metal sheet is a cast material, an arbitrary three-dimensional shape can be easily obtained. A metal sheet obtained by using a cast material or the like as a base material and subjecting the base material to plastic forming such as extrusion, rolling, forging, or pressing has strength and rigidity further increased by work hardening. A metal sheet subjected to polishing, correction, or surface treatment is excellent in designability. A metal sheet subjected to anticorrosion treatment is excellent in corrosion resistance. Further, homogenization of the composition and removal of distortion due to plastic forming can be achieved by heat treatment, and a metal sheet having a desired size and thickness can be obtained by cutting. The metal sheet may be appropriately manufactured and utilized in a desired shape and form.

[Resin Member]

The resin member 30 includes an inner resin part 31 filled in the through hole 23a of the metal sheet 20, and an exposed resin part 32 provided to be continuous with the inner resin part 31 and to extend to the inner surface of the bent portion 21 through an edge portion of the inner opening 22i. Here, the resin member 30 does not extend on the outer surface of the bent portion 21, and the outer surface of the resin member 30 (inner resin part 31) is flush with the outer surface of the metal sheet 20. Further, the resin member 30 may be provided to be continuous with the inner resin part 31 and to extend to the outer surface of the bent portion 21 through an edge portion of the outer opening 22o (not illustrated).

The exposed resin part 32 is provided in at least two opposed directions from the center axis of the through hole 23a (inner opening 22i) on the inner surface of the bent portion 21. For example, when the composite member is a housing having a bottom sheet part and a side wall part, the exposed resin part 32 is provided over the bottom sheet part and the side wall part. The length (a length m in the lower diagram of FIG. 1) of the exposed resin part 32 from the edge portion of the inner opening 22i along the inner surface of the bent portion 21 is set to be 0.8 times or more the length (a length n in the middle diagram of FIG. 1) from the center axis of the through hole 23a to the edge portion of the inner opening 22i. By making the exposed resin part 32 so that the length is 0.8 times or more, the joint area between the exposed resin part 32 and the metal sheet 20 can be increased, and the resin member 30 is hard to come off the metal sheet 20. Specifically, since the through holes 23a is tapered, the inner resin part 31 is hard to come off toward the inner side of the bent portion 21. Since the exposed resin part 32 extends over a wide range from the edge portion of the inner opening 22i to the inner surface of the bent portion 21, it is hard to come off to the outer side of the bent portion 21. The length m is more preferably 0.9 times or more the length n, and further preferably twice or more. In particular, the length m is preferably equal to or more than the length from the center axis of the through hole 23a to the edge portion of the outer opening 22o (a length k in the middle diagram of FIG. 1). This can make the resin member 30 hard to come off the metal sheet 20.

By making the length m from the edge portion of the through hole 23a along the inner surface of the bent portion 21 uniform in the circumferential direction of the through hole 23a, the forming position of an engaging portion (to be described later) to be engaged with a retrofit part is determined easily. Further, the exposed resin part 32 may be radially formed from the edge portion of the inner opening 22i.

The exposed resin part 32 is shaped like a sheet that is substantially uniform in thickness along the inner surface of the metal sheet 20. Alternatively, the exposed resin part 32 is partly different in thickness, that is, for example, has a projecting portion. The thickness of the sheet-like portion of the exposed resin part 32 in the thickness direction of the metal sheet 20 is within the range of 0.5 to 5.0 mm. When the thickness is 0.5 mm or more, a joint portion to a retrofit part 100 to be described later is easily formed. When the joint area is increased, the composite member 1 and the retrofit part 100 are hard to separate from each other. Since the joint portion more easily formed in the exposed resin part 32 as the thickness increases, the thickness is more preferably 1.0 mm or more. Since the size of the exposed resin part 32 increases as the thickness increases, the thickness is further preferably 3.0 mm or less.

The material of the resin member 30 is appropriately selected according to the usage of the composite member 1 in consideration of hardness, corrosion resistance, durability, and heat resistance of the material, and is not particularly limited. As an example, thermoplastic resin or thermosetting resin can be given, and specific examples are polypropylene resin, polyethylene resin, polystyrene resin, polyvinyl chloride resin, polyethylene terephthalate resin, polybutylene terephthalate resin, polycarbonate resin, acrylic resin, epoxy resin, phenol resin, and silicone resin. Alternatively, as the material of the resin member 30, a rubber material is given, and specific examples are natural rubber or synthetic rubber such as isoprene rubber, styrene rubber, nitrile rubber, chloroprene rubber, acrylic rubber, silicone rubber, and urethane rubber. For example, filler and a color batch may be mixed in a resin member formed of these materials.

[Joining of Metal Sheet and Resin Member]

As illustrated in the lower diagram of FIG. 1, the metal sheet 20 and the resin member 30 are joined by filling the tapered recess 23 (through hole 23*a*) provided in the metal sheet 20 with the inner resin part 31 and forming the exposed resin part 32 to be continuous with the inner resin part 31. Since the exposed resin part 32 is formed to extend to the inner surface of the bent portion 21 through the edge portion of the inner opening 22*i*, the inner resin part 31 and the exposed resin part 32 are caught in the region continuing from the narrow face of the taper surface toward the inner surface of the bent portion 21. Hence, the tapered recess 23 serves as a fall prevention structure, and allows the metal sheet 20 and the resin member 30 to be joined firmly.

«Composite-Member Manufacturing Method»

A composite-member manufacturing method according to this embodiment includes the following steps, that is, a preparation step, a recess forming step, a bending step, and a resin filling step. The steps will be described in order below with reference to FIG. 1.

[Preparation Step (Punching Step)]

First, a metal sheet shaped like a flat sheet is prepared. This metal sheet shaped like a flat sheet can be obtained by a punching step of punching a blank formed of the material of the metal sheet into a predetermined shape, such as a rectangular shape, to form a flat sheet. Alternatively, a metal sheet that has been punched into the predetermined shape can be used. When the metal sheet shaped like a flat sheet is formed by punching the blank, the blank can be produced through various steps such as casting, extrusion, rolling, and forming.

[Recess Forming Step]

Next, as illustrated in the upper diagram of FIG. 1, a recess 23 is forming in a metal sheet 20 shaped like a flat sheet with a punch P or the like. Here, the recess 23 is formed by boring a through hole 23*a* having openings 22 (an inner opening 22*i* and an outer opening 22*o*) in both surfaces of the metal sheet 20. The through hole 23*a* is formed in at least a part of a portion subjected to bending in a bending step to be described later. The forming position of the through hole 23*a* will be described in detail when engagement of a composite member and retrofit parts is described later.

The openings 22 of the through hole 23*a* may have various shapes such as a circular shape, a rectangular shape, and an elliptic shape. It is only necessary that the size of the openings 22 of the through hole 23*a* should be set to prevent resin filled in the through hole 23*a* from coming off the metal sheet 20 when the through hole 23*a* is filled with the resin and a resin member 30 is formed to extend to an inner surface of a bent portion 21 of the metal sheet 20. For example, when the openings 22 of the through hole 23*a* is circular, the diameter of the openings 22 is within the range of 1.0 to 10.0 mm.

The through hole 23*a* can be bored simultaneously with punching the blank in the predetermined shape. By performing the punching step and the recess forming step simultaneously, the number of steps can be reduced, and the metal sheet 20 having the through hole 23*a* can be obtained efficiently.

[Bending Step]

Next, as illustrated in the middle diagram of FIG. 1, the metal sheet 20 is subjected to bending with the inner opening 22*i* being disposed on the inner side of a bent portion. By performing bending with the inner opening 22*i* being disposed on the inner side of the bent portion, a taper is formed in the through hole 23*a* to taper off along the bent from the outer side of the bent portion (outer opening 22*o*) toward the inner side of the bent portion (inner opening 22*i*).

Bending is performed on the condition that a ratio R/d of an inner bending radius R and a diameter d of the inner opening 22*i* of the through hole 23*a* is 1.0 or less. By performing bending at the ratio R/d of 1.0 or less, an angle $\theta$ at the intersection of extension lines of the taper of the through hole 23*a* can be made about 60 degrees or more. The angle $\theta$ can become substantially 90 degrees when the ratio R/d is 0, and the inner space of the composite member 1 can be widened. Hence, when the through hole 23*a* is filled with resin and the resin member 30 is formed to extend to the inner surface of the bent portion 21 of the metal sheet 20, the resin filled in the through hole 23*a* can be hard to come off the metal sheet 20.

[Resin Filling Step]

Next, as illustrated in the lower diagram of FIG. 1, the through hole 23*a* is filled with resin, and the resin is molded to extend to the inner surface of the bent portion 21 through an edge portion of the inner opening 22*i*. The resin is molded by injection molding such that a portion of the metal sheet 20 near the forming position of the recess 23 is disposed in a mold and unset resin is injected into the mold.

As illustrated in the lower diagram of FIG. 1, in a composite member 1 manufactured by the above-described composite-member manufacturing method, the tapered through hole 23*a* formed in the bent portion 21 of the metal sheet 20 is filled with resin (inner resin part 31), and resin (exposed resin part 32) is formed to be continuous with the inner resin part 31 and to extend to the inner surface of the bent portion 21 through the edge portion of the inner opening 22*i*. Since the through hole 23*a* is tapered to taper off toward the inner opening 22*i*, the inner resin part 31 and the exposed resin part 32 are caught in a region continuing from the taper surface to the inner surface of the bent portion 21. This allows the metal sheet 20 and the resin member 30 to be joined firmly.

«Engagement of Composite Member and Retrofit Part»

When the resin member 30 serves as an attachment portion for a retrofit part, it is only necessary that the resin member 30 should have a shape such as to allow the resin member 30 and the retrofit part to be mechanically joined.

Figure 2:
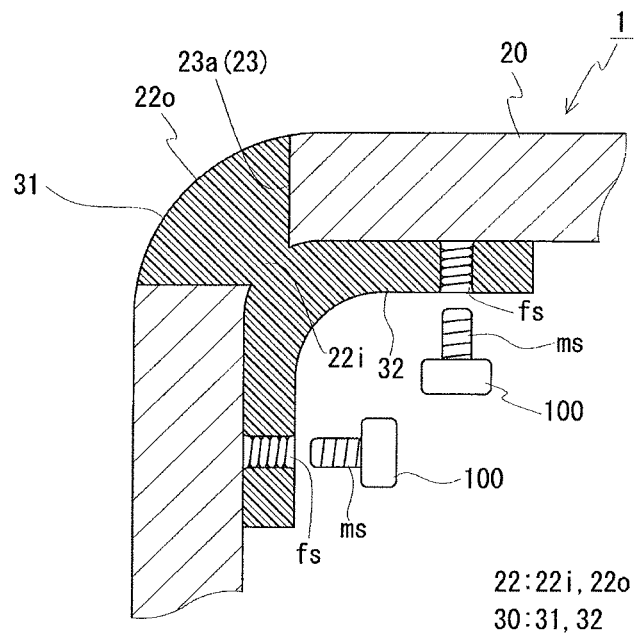
FIG. 2 is a schematic view illustrating an engaging state of the composite member of the first embodiment and retrofit parts.

For example, as illustrated in FIG. 2, the exposed resin part 32 of the resin member 30 is subjected to threading to form internal thread portions fs. In this case, retrofit parts 100 can be attached to the composite member 1 by screwing the internal thread portions fs of the resin member 30 and external thread portions ms of the retrofit parts 100 together. Conversely, projecting portions (not illustrated) are formed in the exposed resin part 32 and are subjected to threading to form external thread portions. In this case, retrofit parts can be attached to the composite member 1 by screwing the external thread portions in internal thread portions of the retrofit parts.

Figure 3:
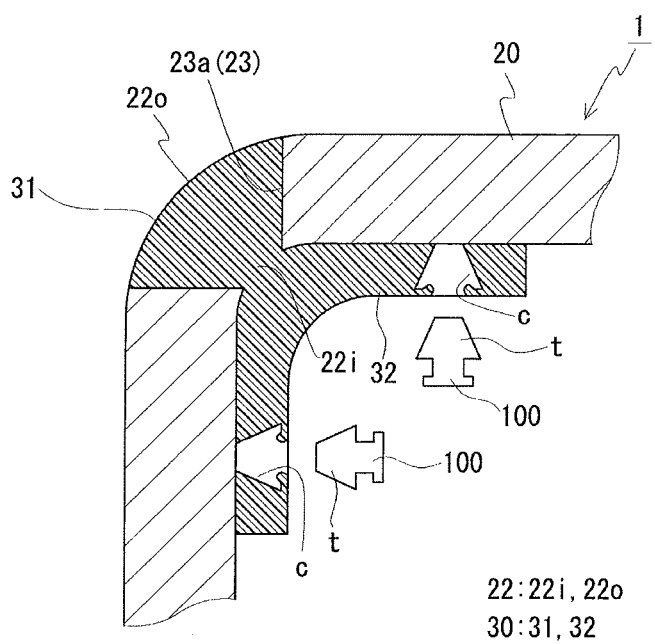
FIG. 3 is a schematic view illustrating an engaging state of the composite member of the first embodiment and retrofit parts.

Besides, for example, as illustrated in FIG. 3, tapered portions t are formed in retrofit parts 100, and fitting portions c to match the shape of the tapered portions t are formed in the exposed resin part 32 of the resin member 30. The fitting portions c can be formed by using a core shaped like a truncated cone corresponding to the shape of the tapers t of the retrofit parts 100. In this case, the fitting portions c preferably have thin portions provided near opening edges on the insertion sides of the retrofit parts 100 to project toward the inner sides of the fitting portions c. Since the thin portions are thin and easily deform, the core can be taken out when the fitting portions c are formed, and the retrofit parts 100 can be removably attached. When the resin member 30 is formed of a rubber material, formation of the thin portions may be omitted. Conversely, for example, projecting portions (not illustrated) are formed in the exposed resin part 32, tapered portions are formed in the projecting portions, and fitting portions to match the shape of the tapered portions are formed in retrofit parts.

Since the resin member 30 is provided to extend to the inner surface of the bent portion 21 of the metal sheet 20, it can also serve a function of protecting an inner corner portion of the bent portion 21. Further, since the inner resin part 31 of the resin member 30 is formed at a corner of an outer surface of the metal sheet 20 in this embodiment, it can protect the corner on the outer side.

Figure 4:
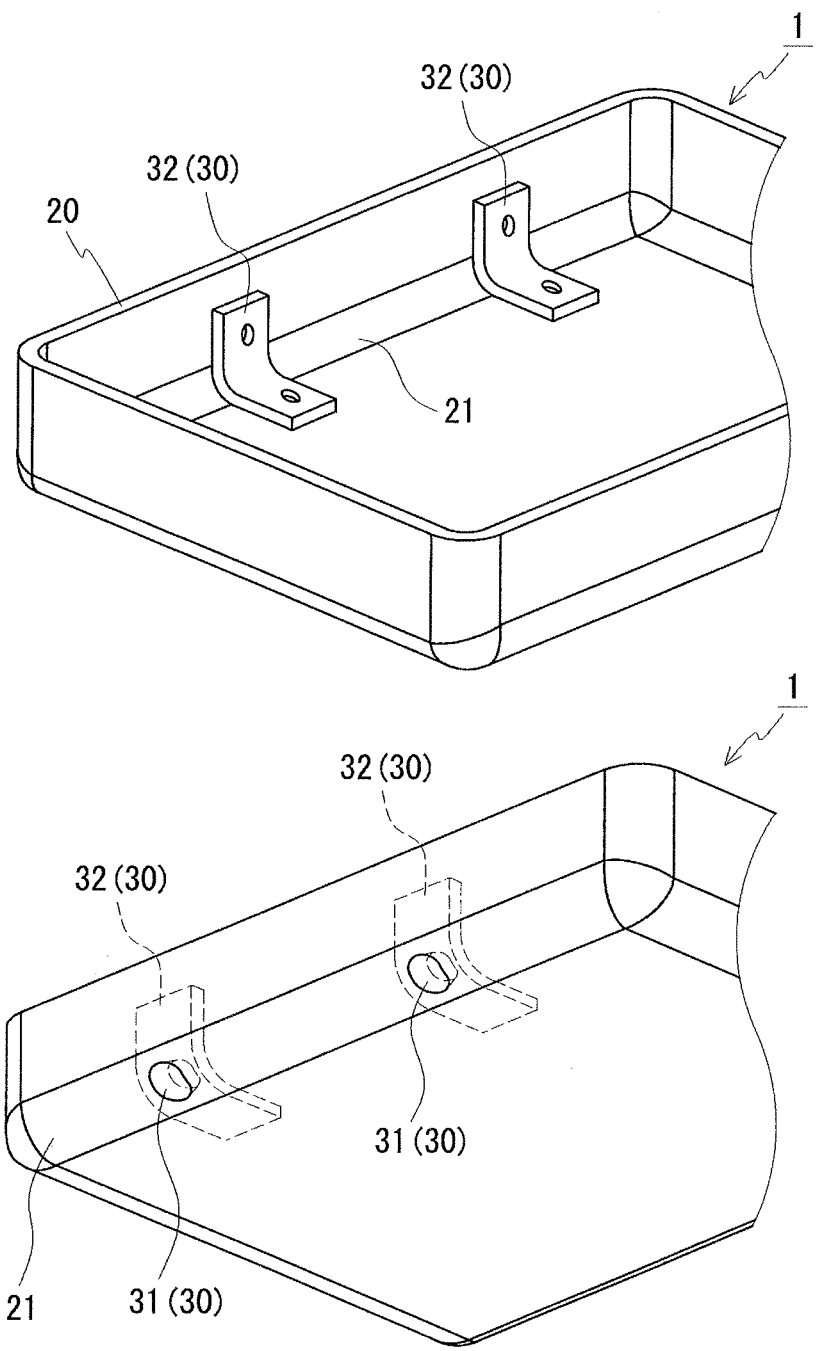
FIG. 4 is a schematic view illustrating an arrangement manner of resin members in the composite member of the first embodiment.

For example, when the composite member 1 is a housing having a bottom sheet part and a side wall part, as illustrated in FIG. 4, a plurality of joint portions between the metal sheet 20 and the resin member 30 are provided in parts of the bent portion 21 of the metal sheet 20. Here, two resin members 30 having the same shape are arranged at a distance from each other in the ridge line direction of the bent portion. The upper diagram of FIG. 4 illustrates the composite member 1 when viewed from the inner side, and the lower diagram of FIG. 4 illustrates the composite member 1 when viewed from the outer side. As illustrated in the upper diagram of FIG. 4, each of the exposed resin parts 32 of the resin members 30 is formed to extend from the bottom sheet part to the side wall part of the bent portion 21, and is provided with an equal length along the bottom sheet part and the side wall part. As illustrated in the lower diagram of FIG. 4, each of the inner resin parts 31 of the resin members 30 is filled in the through hole and the outer surface of the inner resin part 31 is flush with the outer surface of the metal sheet 20. Also, the inner resin part 31 is shaped to taper off from the outer side toward the inner side of the bent portion 21. The inner resin part 31 and the exposed resin part 32 are continuous with each other, and the exposed resin part 32 is provided to extend to the inner surface of the bent portion 21 through the inner opening of the through hole. Hence, the inner resin part 31 and the exposed resin part 32 are joined by being caught by the metal sheet 20.

Figure 5:
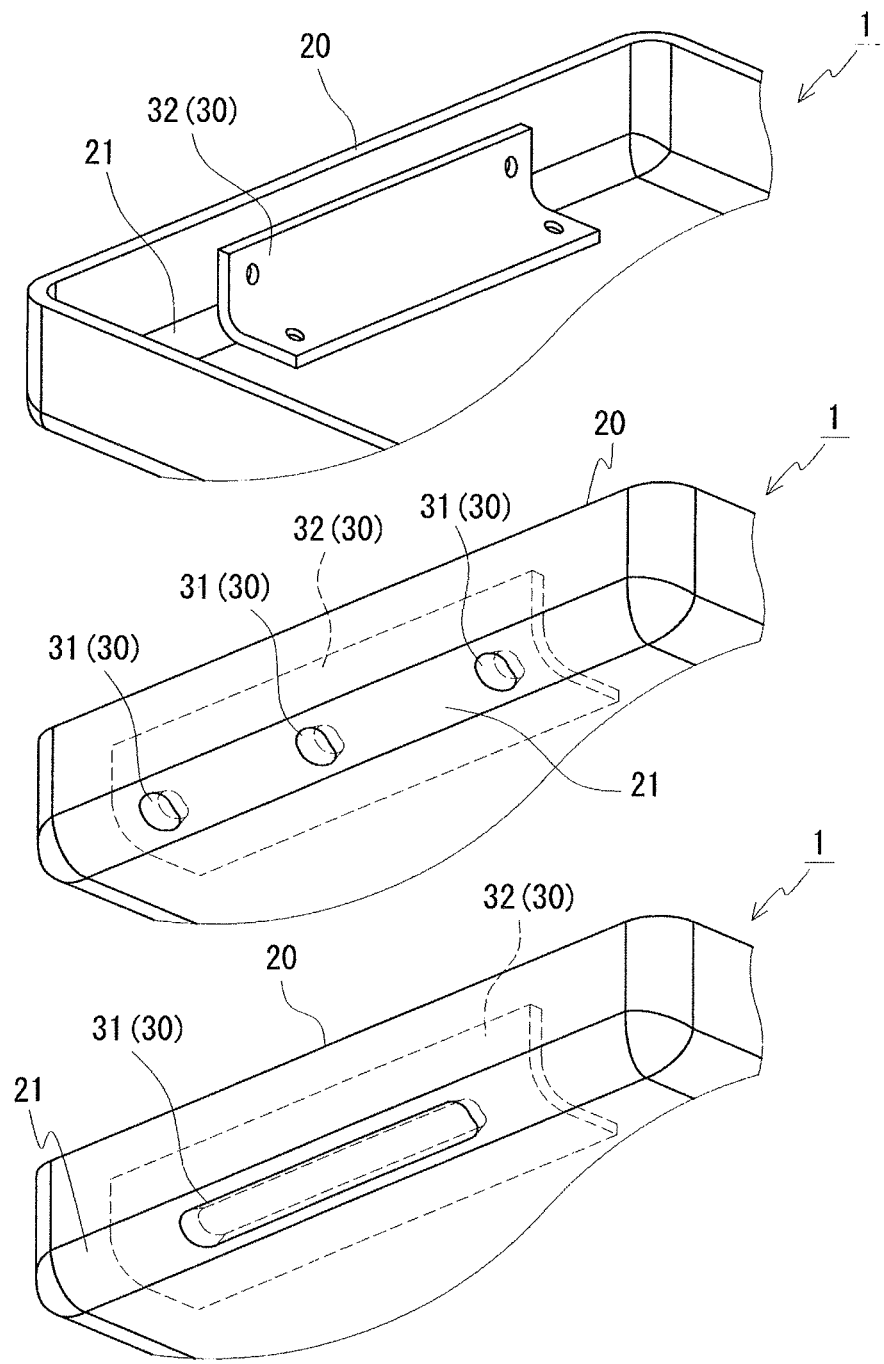
FIG. 5 is a schematic view illustrating an arrangement manner of resin members in the composite member of the first embodiment.

Besides, for example, as illustrated in FIG. 5, one resin member 30 is disposed along the bent portion 21 of the metal sheet 20. The upper diagram of FIG. 5 illustrates the composite member 1 when viewed from the inner side, and the middle and lower diagrams of FIG. 5 illustrate the composite member 1 when viewed from the outer side. As illustrated in the upper diagram of FIG. 5, an exposed resin part 32 of the resin member 30 is shaped like a long piece L-shaped in a cross section extending in the ridge line direction of the bent portion 21, and portions of the exposed resin part 32 extending from the center axis of the through hole along the bottom sheet part and the side wall part are equal in length. As illustrated in the middle diagram of FIG. 5, for example, inner resin parts 31 of the resin member 30 are arranged at regular intervals along the ridge line direction of a corner portion formed by bending.

That is, three through holes are bored at regular intervals in the recess forming step, and the through holes are filled with resin to form inner resin parts 31 in the resin filling step. Moreover, one exposed resin part 32 is formed to be continuous with the inner resin parts 31. Thus, one exposed resin part 32 is fixed at three positions, and this can more firmly join the resin member 30 and the metal sheet 20. As another example of the inner resin part 31, as illustrated in the lower diagram of FIG. 5, one inner resin part 31 is disposed along the ridge line direction of the corner portion. In this example, a thin and long through hole is formed in the recess forming step. The through hole is formed to extend along the ridge line direction of a bent portion 21 when the bent portion 21 is formed in the later bending step. One exposed resin part 32 is formed to be continuous with one inner resin part 31.

By setting a position where the inner resin part 31 can be seen from the outer side of the composite member 1 at a desired position, the composite member 1 can have textures of both of metal and resin. For example, designability can be enhanced by changing the color of the resin or decorating the resin. Further, an outer corner portion of the metal sheet 20 formed by bending can be protected by forming the inner resin part 31 in a portion on the outer side of the composite member 1 to be protected.

Besides, when the resin member 30 is transparent or semi-transparent, light can be emitted to the outer side of the composite member 1 through the resin member 30 by disposing a light, such as an LED (light emitting diode), on the inner side of the metal sheet 20 and illuminating the light. Further, when the through hole is formed in the shape of a character when viewed from the outer side of the composite member 1, design can be made such that a light emitting character is provided in the bent portion.

Second Embodiment

Figure 6:
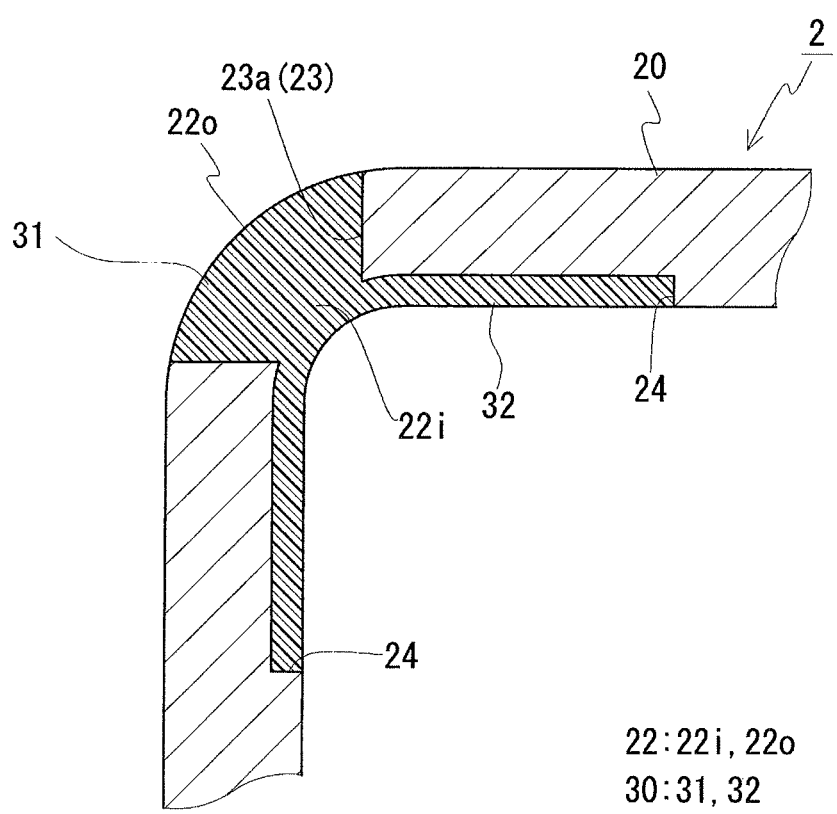
FIG. 6 is a cross-sectional view of a composite member according to a second embodiment.

A composite member 2 according to a second embodiment will be described with reference to FIG. 6. The basic structure of the composite member 2 is similar to that of the composite member 1 of the first embodiment, and is different only in the form of a metal sheet 20. Here, this difference will be described, and descriptions of other structures will be skipped.

The metal sheet 20 has a fitting recess 24 to be filled with an exposed resin part 32 of a resin member 30. For example, as illustrated in FIG. 6, the fitting recess 24 has a depth corresponding to the thickness of the exposed resin part 32. This increases the joint area between the metal sheet 20 and the resin member 30, and the exposed resin part 32 is caught by the metal sheet 20. Hence, the metal sheet 20 and the resin member 30 can be joined more firmly. Further, on an inner surface of the composite member 2, an inner surface of the exposed resin part 32 can be flush with an inner surface of the metal sheet 20, and this can widen the inner space. While the depth of the fitting recess 24 is equal to the thickness of the exposed resin part 32 here, it may be less than the thickness of the exposed resin part 32.

Third Embodiment

A composite member 3 according to a third embodiment will be described with reference to FIG. 7. The basic structure of the composite member 3 is similar to that of the composite member 2 of the second embodiment, and is different only in the form of a resin member 30. Here, this difference will be described, and descriptions of other structures will be skipped. The upper diagram of FIG. 7 illustrates the composite member 3 when viewed from the inner side, and the middle and lower diagrams of FIG. 7 illustrate the composite member 3 when viewed from the outer side.

Figure 7:
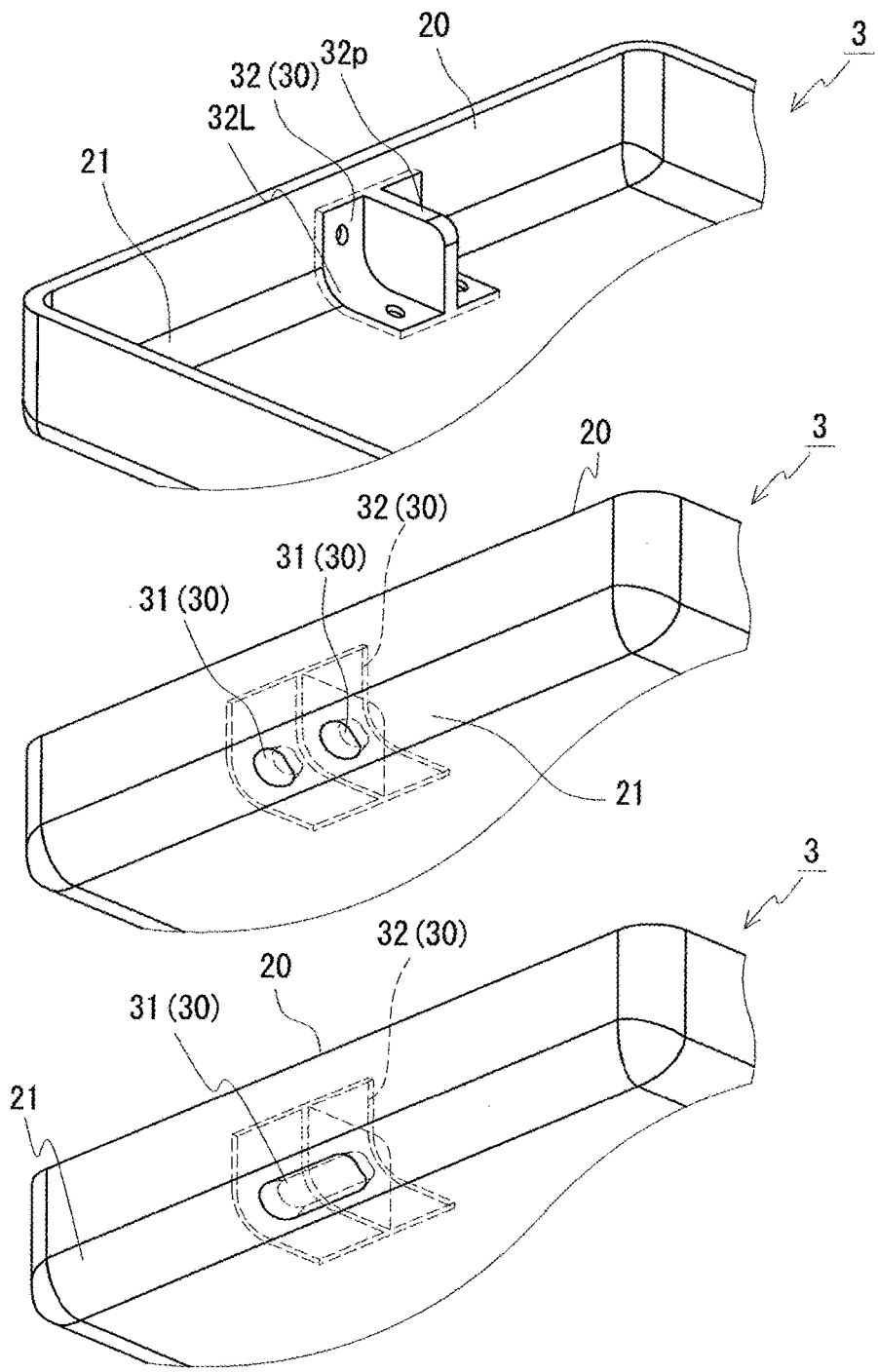
FIG. 7 is a schematic view illustrating an arrangement manner of a resin member in a composite member according to a third embodiment.

As illustrated in the upper diagram of FIG. 7, an exposed resin part 32 of the resin member 30 includes an L-shaped piece 32 shaped like a short piece L-shaped in a cross section extending in the ridge line direction of a bent portion 21, and a partitioning piece 32p provided at almost the center of the L-shaped piece. The L-shaped piece 32 is disposed in a fitting recess described in conjunction with the second embodiment. That is, on an inner surface of the composite member 3, an inner surface of the L-shaped piece 32 of the exposed resin part 32 is flush with an inner surface of a metal sheet 20. Similarly to the first embodiment with reference to FIG. 5, one or more inner resin parts 31 of the resin member 30 can be formed. When two inner resin parts 31 are formed, they are arranged with the partitioning piece 32p being disposed therebetween along the ridge line direction of a corner portion formed by bending. When one inner resin part 31 is formed, it is disposed so that the partitioning piece 32p is located at the center in the ridge line direction of the corner portion, as illustrated in the lower diagram of FIG. 7.

Fourth Embodiment

Figure 8:
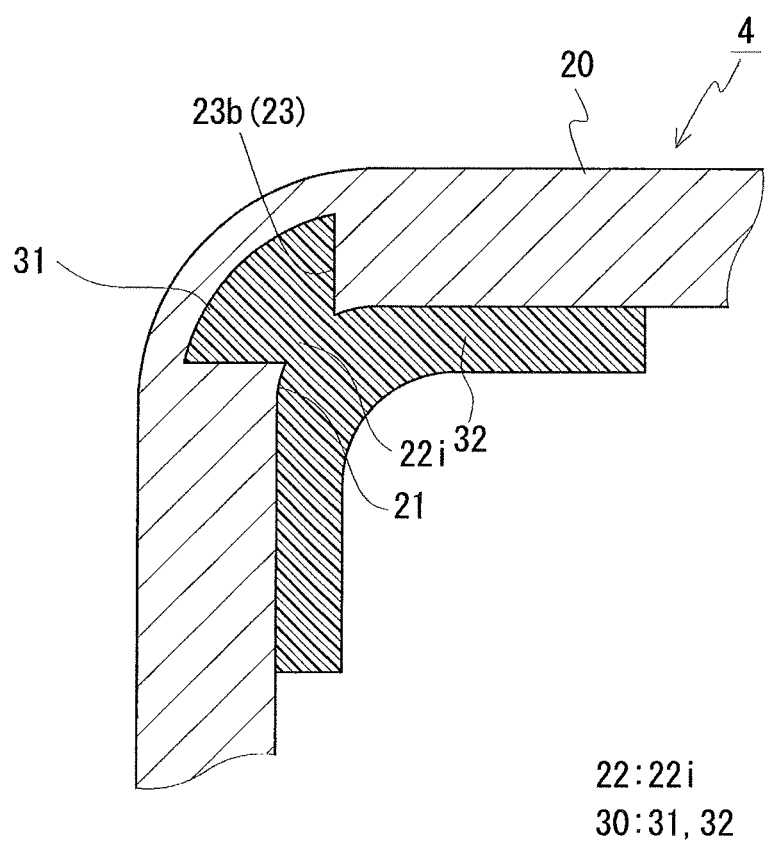
FIG. 8 is a cross-sectional view of a composite member according to a fourth embodiment.

A composite member 4 according to a fourth embodiment will be described with reference to FIG. 8. The basic structure of the composite member 4 is similar to that of the composite member 1 of the first embodiment, and is different only in the form of a recess 23 of a metal sheet 20. Here, this difference will be described, and descriptions of other structures will be skipped.

The recess 23 is a groove 23b having an inner opening 22i on an inner side of a bent portion 21. That is, the recess 23 does not have an opening on an outer side of the bent portion 21, and does not penetrate the bent portion 21. Herein, the groove includes not only a popular long recess having a certain length, but also a hole having a circular opening. The groove 23b is tapered to taper off from a bottom portion of the groove 23b toward the inner opening 22i. The angle of an inclined surface of the taper is similar to that adopted in the first embodiment.

It is only necessary that the depth of the groove 23b should be such that resin filled in the groove 23b does not come off the metal sheet 20 when the groove 23b is filled with the resin and a resin member 30 is formed to extend to the inner surface of the bent portion 21 of the metal sheet 20. For example, the depth of the groove 23b is within the range of 0.2 to 3.0 mm.

Since a through hole does not exist in the outer surface of the composite member 4 because the recess 23 is formed by the groove 23b, the composite member 4 can have a metallic texture all over the outer side when viewed from the outer side.

INDUSTRIAL APPLICABILITY

The composite member of the present invention can be suitably used in a member to which various parts are desired to be attached, for example, a housing of a mobile device or a personal computer. Further, the composite-member manufacturing method of the present invention can be suitably used to obtain composite members for use in various housings.

REFERENCE SIGNS LIST 1, 2, 3, 4 composite member
20 metal sheet
21 bent portion
22 opening 22i inner opening 22o outer opening
23 recess 23a through hole 23b groove 24 fitting recess
30 resin member
31 inner resin part 32 exposed resin part 32L L-shaped piece
32p partitioning piece
100 retrofit part
ms external thread portion fs internal thread portion
T taper portion c fitting portion
P punch

The invention claimed is:

1. A composite member comprising:
a metal sheet having a bottom sheet part, a sidewall part, and a bent portion therebetween formed by bending the metal sheet toward an inner surface of the bottom sheet part and the side wall part, the bent portion having a through hole, and the through hole having an outer opening disposed along an outer surface of the bottom sheet part and the side wall part and an inner opening disposed along the inner surface of the bent portion, the through hole being tapered with the outer opening having a diameter that is larger than the inner opening, the through hole opening into a fitting recess, the fitting recess having a depth less than the thickness of the metal sheet and extending from the inner opening on the inner surface of the bottom part and the sidewall part; and
a resin member joined to at least a part of the bent portion, the resin member being flush with the outer surface of the bottom sheet part and the side wall part, the resin member comprising:
an inner resin part filled in the through hole; and
an exposed resin part continuous with the inner resin part overlapping a portion of the inner surface of the bottom sheet part and the side wall part on each side of the inner opening filling the fitting recess, the exposed resin part following a contour of the inner surface of the bottom sheet part and the side wall part such that the exposed resin part has a bottom resin part, a sidewall resin part, and a bent resin portion therebetween.

2. The composite member according to claim 1, wherein an angle at the intersection on extension lines of the taper of the through hole is within the range of 60 to 150 degrees.

3. The composite member according to claim 1, wherein a thickness of the exposed resin part forming the bottom resin part and/or the sidewall resin part is substantially uniform.

4. The composite member according to claim 3, wherein the thickness is within the range of 0.5 to 5.0 mm.

5. The composite member according to claim 1, the length of the bottom resin part and/or the side wall resin part extending from the inner opening is set to 0.8 or more times a length from a center axis of the through hole to an edge of the inner opening.

6. The composite member according to claim 1, wherein the exposed resin part within the fitting recess is flush with the non-recess inner surface of the metal sheet.

7. The composite member according to claim 1, wherein the through hole comprises a plurality of through holes and the corresponding resin member comprises a plurality of inner resin parts continuous with the exposed resin portion.

8. The composite member according to claim 1, wherein a plurality of resin members are formed along the bent portion at corresponding through holes.

9. The composite member according to claim 1, wherein the resin member serves as an attachment portion for a retrofit part to be mechanically joined, wherein the exposed resin part forming the bottom resin part and/or the sidewall resin part comprises a threaded portion or a tapered portion with fitting portions.

10. The composite member according to claim 9, wherein the threaded portion or the tapered portion with fitting portions is formed externally as a projecting portion or internally as a hole portion.

11. The composite member according to claim 1, wherein the material of the resin member is selected from thermoplastic resin, a thermosetting resin, or a rubber material.

12. The composite member according to claim 11, wherein the thermoplastic resin or thermosetting resin is polypropylene resin, polyethylene resin, polystyrene resin, polyvinyl chloride resin, polyethylene terephthalate resin, polybutylene terephthalate resin, polycarbonate resin, acrylic resin, epoxy resin, phenol resin, or silicone resin.

13. The composite member according to claim 11, wherein the rubber material is isoprene rubber, styrene rubber, nitrile rubber, chloroprene rubber, acrylic rubber, silicone rubber, or urethane rubber.

14. The composite member according to claim 1, wherein the metal sheet is at least one of pure magnesium, a magnesium alloy, pure titanium, a titanium alloy, pure aluminum, an aluminum alloy, pure iron, or an iron alloy.

15. The composite member according to claim 1, wherein the composite member is a housing of an electric device.

16. A composite member manufacturing method comprising:
  a preparation step of preparing a metal sheet shaped like a flat sheet, the metal sheet having an outer surface and an inner surface;
  a through hole forming step of forming a through hole in at least a part of a portion of the metal sheet to be subjected to bending, the through hole having an outer opening in the outer surface and an inner opening in the inner surface, the through hole opening into a fitting recess, the fitting recess having a depth less than the thickness of the metal sheet;
  a bending step of subjecting the metal sheet to bending along the inner surface such that it forms a bottom sheet part, a side wall part, and a bent portion therebetween with the outer opening disposed along an outer surface of the bottom sheet part and the sidewall part and the inner opening being disposed along the inner surface of the bent portion, the through hole being tapered with the outer opening having a diameter that is larger than the inner opening, the fitting recess extending from the inner opening on the inner surface of the bottom part and the sidewall part; and
  a filling step of filling the through hole with resin and molding the resin so that the resin forms a resin member joined to at least a part of the bent portion, the resin member being flush with the outer surface of the bottom sheet part and the sidewall part and not overlapping the outer surface of the bottom sheet part and the sidewall part, the resin member comprising:
    an inner resin part filled in the through hole; and
    an exposed resin part continuous with the inner resin part overlapping an inner surface of the bottom sheet part and the side wall part on each side of the inner opening filling the fitting recess, the exposed resin part following a contour of the inner surface of the bottom sheet part and the sidewall part such that the exposed resin part has a bottom resin part, a sidewall resin part, and a bent resin portion therebetween.

17. The composite member manufacturing method according to claim 16,
  wherein the preparation step includes a punching step of punching a blank in a predetermined shape to form the metal sheet shaped like a flat sheet, and
  wherein the through hole forming step is performed simultaneously with the punching step.

18. The composite member manufacturing method according to claim 16, further comprising a forming metal sheet step before the preparation step comprising least one of casting, extrusion, rolling, forging, and pressing.

19. The composite member manufacturing method according to claim 16, wherein the preparation step includes subjecting the metal sheet to at least one of heat treatment, polishing, correction, and anticorrosion treatment.

20. The composite member manufacturing method according to claim 16, wherein the filling step comprises injection molding.

21. A composite member manufactured by the composite-member manufacturing method according to claim 16.

* * * * *